United States Patent
Verwegen

(10) Patent No.: US 7,401,278 B2
(45) Date of Patent: Jul. 15, 2008

(54) EDGE-TRIGGERED MASTER + LSSD SLAVE BINARY LATCH

(75) Inventor: Peter Verwegen, Rottenburg (DE)

(73) Assignee: International Business Machines Corporation, Armonk, NY (US)

(*) Notice: Subject to any disclaimer, the term of this patent is extended or adjusted under 35 U.S.C. 154(b) by 161 days.

(21) Appl. No.: 10/904,804

(22) Filed: Nov. 30, 2004

(65) Prior Publication Data

US 2005/0216806 A1    Sep. 29, 2005

(30) Foreign Application Priority Data

Mar. 29, 2004  (EP)  ................................. 04101287

(51) Int. Cl.
G01R 31/28 (2006.01)
H03K 3/289 (2006.01)

(52) U.S. Cl. ................... 714/726; 714/729; 327/202

(58) Field of Classification Search ................. 714/726, 714/729; 327/202

See application file for complete search history.

(56) References Cited

U.S. PATENT DOCUMENTS

| 5,838,693 A * | 11/1998 | Morley | 714/726 |
| 5,920,575 A * | 7/1999 | Gregor et al. | 714/726 |
| 6,271,700 B1 * | 8/2001 | Itaya | 327/202 |
| 7,038,494 B2 * | 5/2006 | Morton | 326/93 |
| 7,039,843 B2 * | 5/2006 | Zhang | 714/726 |

* cited by examiner

Primary Examiner—Jacques Louis-Jacques
Assistant Examiner—John J. Tabone, Jr.
(74) Attorney, Agent, or Firm—Robert Walsh; Michael Le Strange

(57) ABSTRACT

A binary latch that operates as an edge-triggered flip-flop and which is LSSD-testable that comprises an edge triggered master. The binary latch comprises an edge triggered master flip-flop (2), with a clock input connected to the system clock (SYS_CLK), with a data input (DI) and with an output (DO), a level sensitive scan design (LSSD) slave latch (3), connected to the output (DO) of the master flip-flop (2), a NAND gate (4) with a first input (41) connected to the system clock (SYS_CLK), a second input (42) connected to a test input (TEST) and with an output (43) connected to the LSSD slave latch clock input (LSSD_clk).

9 Claims, 2 Drawing Sheets

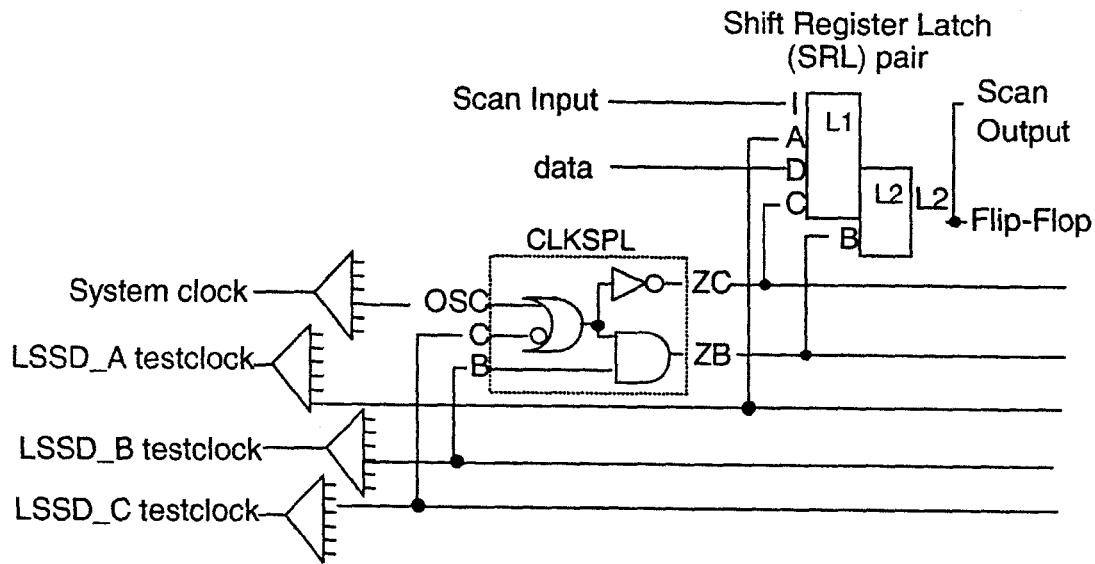
FIG. 3 (State of the art)
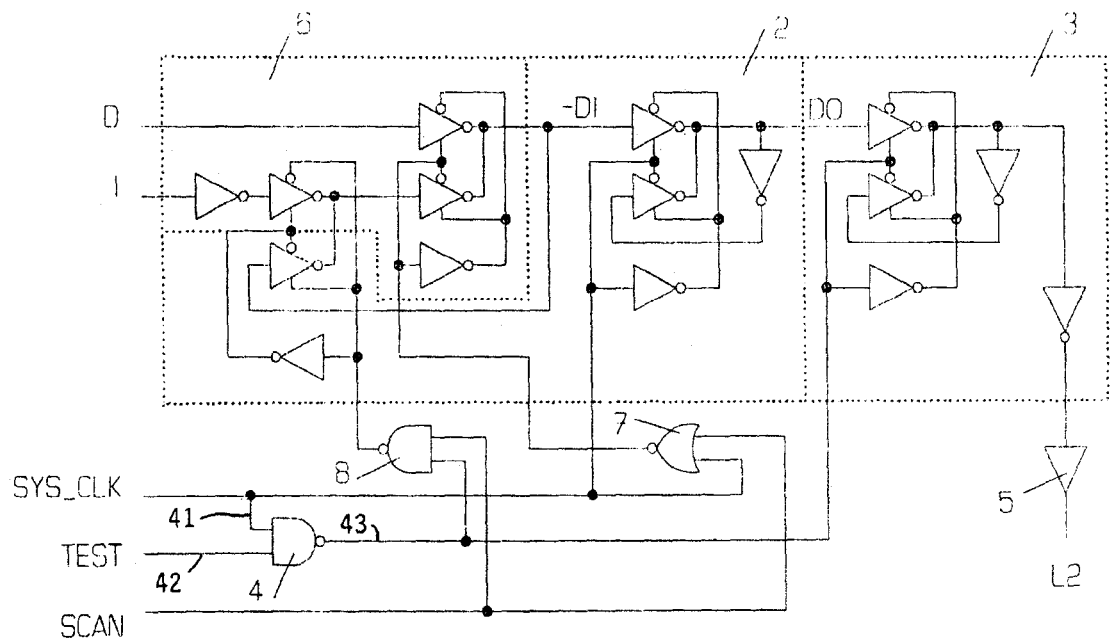
FIG. 4

EDGE-TRIGGERED MASTER + LSSD SLAVE BINARY LATCH

BACKGROUND OF THE INVENTION

Field of the Invention

The present invention relates to a novel binary latch comprising a master flip-flop and a slave latch.

Description of Related Art

Binary latches are commonly built up with edge-triggered elements; examples are master-only or master and slave flip-flop circuits. Such binary latches have been used in chip architecture for a long time and are present in large quantities for example in registers or state machine design. They have the disadvantage that testing the logic of a circuit containing these latches is rather complex and has to be performed with functional vectors provided by the chip designer.

Another common way to build latches is based on the level sensitive scan design (LSSD) known in the state of the art, which allows testing in an easier way. Such binary latches combine an LSSD master and LSSD slave to a shift register latch pair (SRL). In order to make an LSSD latch perform like an edge-triggered element a clock splitter (CLKSPL) has to be added as shown in FIG. 3. For LSSD testing the SRL is clocked in a different way than in normal operation mode. In the example shown in FIG. 3 an LSSD_A testclock for copying the scan input (Scan Input) into the master L1 latch, an LSSD_C testclock for copying the data (Data) into the master L1 latch and an LSSD_B testclock for copying the master content of the master L1 latch into the slave latch L2 has to be established on the chip besides the devices to provide the system clock (System Clock). As the system clock is the only one relevant in normal operation mode the application needs a large extra overhead of clock-splitters and testclock trees, only to make the product LSSD testable. The three LSSD testclock trees are mostly not well skew-managed, which makes it often necessary to apply the tests with a lower frequency.

SUMMARY OF THE INVENTION

It is an object of the invention to provide LSSD-testable binary latches, which can be used as edge-triggered flip-flops with fewer circuits on the chip for edge triggering as used so far to make LSSD latches work like edge triggered flip-flops.

A further object of the invention is to provide an LSSD-testable latch which does not need different testclocks and clock-splitters.

These objects are solved by the invention as defined in the independent claims.

An embodiment of this invention provides a binary latch with an edge-triggered master flip-flop, with a clock input connected to the system clock, with a data input and with an output, said output is connected to a level sensitive scan design (LSSD) slave latch. This combination is novel and easy to use in LSSD testing with the NAND gate with a first input connected to the system clock, a second input connected with a test input and with an output connected to the LSSD slave latch clock input.

The master flip-flop data input can be connected to a multiplexer which connects data signals or scan input signals according to a selection signal with the master flip-flop.

The LSSD slave latch acts as a delay element when the LSSD slave latch clock input is set to high.

An amplifier element can be connected to the output of the LSSD slave latch to provide higher driving capabilities to the output of the binary latch.

BRIEF DESCRIPTION OF THE DRAWINGS

The invention will now be described in detail with reference to the following description and accompanying drawings in which:

FIG. 3 shows a binary latch as known in the state of the art, which needs different clocks for normal and LSSD testing operation; and FIG. 4 shows a gate-level view of the invention.

DETAILED DESCRIPTION

Figure 1:
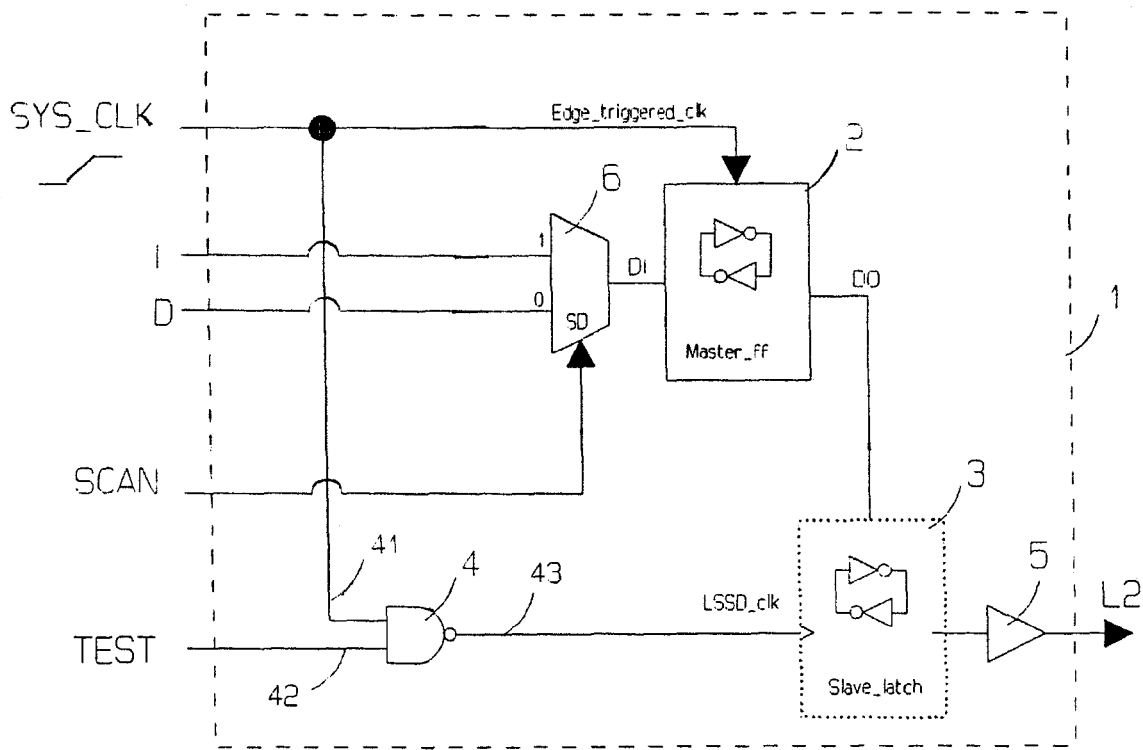
FIG. 1 shows a circuit diagram of a binary latch according to the invention with an edge triggered master flip-flop and a LSSD slave latch.

FIG. 1 depicts a binary latch 1 with an edge triggered master flip-flop 2, with a clock input (edge-triggered clock input) connected to the system clock SYS_CLK. The master flip-flop 2 has a data input DI, which is connected to the output of a multiplexer 6, which connects data signals D or scan input signals I according to a selection signal SCAN with the master flip-flop.

The output DO of master flip-flop 2 is connected to a level sensitive scan design (LSSD) slave latch 3. This novel combination allows testing the device with LSSD principals, yet have the circuit behave in functional mode as an edge-triggered flip-flop.

The clock signals for the slave latch are provided by a NAND gate 4 with a first input 41 which is connected to the system clock SYS_CLK and a second input 42 which is connected with a test input TEST.

The output 43 of the NAND gate 4 is connected to the LSSD slave latch clock input LSSD_clk.

This makes the LSSD slave latch 3 behave like a delay element when the LSSD slave latch clock input LSSD_clk is set to high.

Optionally—as shown in the depicted example—there can be an amplifier element 5, which is connected to the output of the LSSD slave latch 3 to drive the output L2 of the binary latch 1. This makes it possible to drive a plurality of circuits behind the latch.

The novel binary latch allows LSSD testing at full clocking speed and needs only one single clock signal. This allows test patterns to be applied with a much higher speed than with common LSSD latches with a large technical overhead to allow edge triggering.

Figure 2:
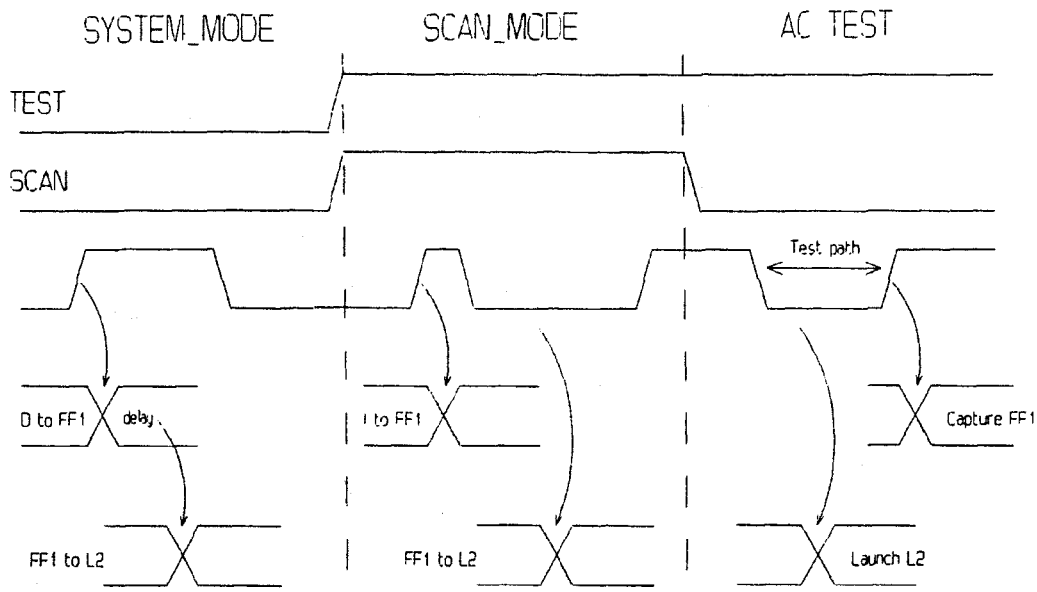
FIG. 2 shows a time diagram of the signals in different conditions.

FIG. 2 shows a diagram of the signals in SYSTEM_MODE (being the desired 'normal' application), SCAN_MODE for a race-free scanning of information into the binary latch and AC TEST mode. This last mode shows the AC test capabilities inherent in the design, which becomes more and more important in future chip generations as clock speeds increase and logical paths between the latches must be tested against the desired frequencies.

The high level view of the invention (FIG. 1) does not imply that this latch can perform a flush condition as well. However, that capability has been built into the design. FIG. 4 shows the gate-level view of the binary latch with the implementation of the master flip-flop 2, the slave latch 3, and the multiplexer 6 in their dotted boxes together with the NAND gate 4 and the amplifier element 5. The NOR gate 7 prohibits data (D) from getting into the master flip-flop (2) when SCAN is high. The NAND gate 8 prohibits the scan input I from getting into the master flip-flop (2) when SCAN is low. The unique logical combination of NAND 4 and NAND 8 make the flush feature available: with SCAN high and TEST low the scan input signal I flushes through the multiplexer 6 to the input of the master flip-flop (-DI, being DI-inverted). When SYS_CLK goes high the master flip-flop flushes the -DI signal to its output DO and while TEST has already been set to low the slave latch acts only as a delay element; the content of the scan input signal I is available at the output L2.

While the present invention has been described in detail, in conjunction with specific preferred embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A binary latch using only one system clock having an output comprising:
    an edge-triggered master flip-flop having a first input connected to the system clock and a second input connected to a data input and an output;
    a level sensitive scan design (LSSD) slave latch which is used only in a test mode with its input connected to the output of the edge-triggered master flip-flop; and
    a first NAND gate having a first input connected to the system clock a second input connected to a test input and an output connected to an LSSD slave latch clock input which controls the output of the binary latch to be either a scan output in test mode or to follow the contents of the edge-triggered master flip-flop depending if the LSSD latch clock input is high or low.

2. The binary latch according to claim 1, which includes a multiplexer that has a scan input signal and a data input signal and supplies either the data signal or the scan signal determined by a selection signal as the input signal to the edge-triggered master flip-flop.

3. The binary latch according to claim 2, wherein said LSSD slave latch LSSD slave latch clock input is set to low and the binary latch is in the test mode.

4. The binary latch according to claim 2, that acts as a standard edge-triggered flip-flop when the LSSD slave latch clock input is set to high.

5. The binary latch according to claim 2, which includes a second NAND gate with a first input connected to the output of the first NAND gate output and a second input connected to the selection signal and an output connected to the multiplexer when the selection signal is set low will establish a signal flush path from the selection signal input to the output of the binary latch.

6. The binary latch according to claim 1, wherein an amplifier element is connected to the output of the LSSD slave latch to drive the output of the binary latch.

7. A binary latch using only one system clock having an output comprising:
    an edge-triggered master flip-flop having a fist input connected to the system clock and a data input and a data output;
    a multiplexer which is connected to the edge-triggered master flip flop data input which connects either a data signal or a scan signal determined by a selection signal applied to the multiplexer;
    a level sensitive scan design (LSSD) slave latch which is only used in test mode, connected to the output of the master flip-flop wherein the LSSD slave latch becomes a delay element when an LSSD slave latch clock input is set to high; and
    a NAND gate having a first input connected to the system clock, a second input connected to a test input and an output connected to the LSSD slave latch clock input.

8. binary latch using only one system clock having an output comprising:
    an edge-triggered master flip-flop which is connected to the system clock and has a data input and an output;
    a level sensitive scan design (LSSD) slave latch which is only used in a test mode, connected to the output of the edge-triggered master flip-flop;
    a NAND gate with a first input connected to the system clock, a second input connected to a test input and with an output connected to an LSSD slave latch clock input; and
    an amplifier element is connected to the output of the LSSD slave latch to drive the output of the binary latch which acts as a standard edge-triggered flip-flop when the LSSD slave latch clock input is set to high.

9. A binary latch using only one system clock having an output comprising:
    an edge-triggered master flip-flop connected to a system clock having a data input and an output;
    a level sensitive scan design (LSSD) slave latch which is only used in a test mode, connected to the output of the edge-triggered master flip-flop wherein said LSSD slave latch acts as a delay element when an LSSD slave latch clock input is set to high; and
    a NAND gate with a first input connected to the system clock, a second input connected to a test input and with an output connected to an LSSD slave latch clock input, which generates the binary latch output that simulates a standard edge-triggered flip-flop when the LSSD slave latch clock input is set to high.

* * * * *